United States Patent
Werner (10) Patent No.: US 8,085,893 B2
(45) Date of Patent: Dec. 27, 2011

(54) LOW JITTER CLOCK RECOVERY CIRCUIT

(75) Inventor: Carl William Werner, Los Gatos, CA (US)

(73) Assignee: Rambus, Inc., Sunnyvale, CA (US)

( * ) Notice: Subject to any disclaimer, the term of this patent is extended or adjusted under 35 U.S.C. 154(b) by 857 days.

(21) Appl. No.: 11/225,559

(22) Filed: Sep. 13, 2005

(65) Prior Publication Data

US 2007/0058768 A1    Mar. 15, 2007

(51) Int. Cl.
    H03D 3/24    (2006.01)
(52) U.S. Cl. .................... 375/376; 375/375; 375/327
(58) Field of Classification Search ............. 375/376, 375/327, 226
    See application file for complete search history.

(56) References Cited

U.S. PATENT DOCUMENTS

| | | | | |
|---|---|---|---|---|
| 5,937,020 | A * | 8/1999 | Hase et al. | 375/376 |
| 5,990,714 | A | 11/1999 | Takahashi et al. | |
| 6,617,936 | B2 | 9/2003 | Dally et al. | |
| 6,630,868 | B2 * | 10/2003 | Perrott et al. | 331/17 |
| RE38,482 | E * | 3/2004 | Leung et al. | 375/357 |
| 6,861,916 | B2 | 3/2005 | Dally et al. | |
| 6,914,465 | B2 * | 7/2005 | Kiyose et al. | 327/156 |
| 6,950,956 | B2 * | 9/2005 | Zerbe et al. | 713/400 |
| 2002/0037065 | A1 * | 3/2002 | Nakamura | 375/375 |
| 2002/0105386 | A1 | 8/2002 | Shastri | |
| 2003/0103591 | A1 * | 6/2003 | Noguchi | 375/376 |
| 2004/0052323 | A1 | 3/2004 | Zhang | |
| 2004/0223575 | A1 | 11/2004 | Meltzer et al. | |
| 2005/0231249 | A1 * | 10/2005 | Tani | 327/158 |
| 2008/0212730 | A1 * | 9/2008 | Tang et al. | 375/376 |

OTHER PUBLICATIONS

"Monolithic Phase-Locked Loops and Clock Recovery Circuits, Theory and Design," Behzad Razavi, ed., IEEE Press (1994), pp. 33-35.

Emami-Neyestanak, Azita, Samuel Palermo, Hae-Chang Lee and Mark Horowitz, "CMOS Transceiver with Baud Rate Clock Recovery, for Optical Interconnects," Computer Systems Lab., Stanford, CA, Jun. 17-19, 2004.

Gursoy, Zafer Ozgur (ST Microelectronics), and Yusuf Leblebici (Swiss Federal Inst. of Tech.—Lausanne), "Design and Realization of a 2.4 Gbps—3.2 Gbps Clock and Data Recovery Circuit Using Deep-Submicron Digital CMOS Technology." Jan. 2003.

Hogge, JR., Charles R., "A Self Correcting Clock Recovery Circuit," J. of Lightwave Tech., vol. LT-3, No. 6, Dec. 1985.

Kim, Dong-Hee and Jin-Ku Kang, "A 1.0-Gbps Clock and Data Recovery Circuit with Two-XOR Phase-Frequency Detector," Dept. of Electrical and Computer Engineering, Inha Univ., Inchon, Korea, Aug. 6, 2002.

Kim, Jaeha and Mark A. Horowitz, "Adaptive Supply Serial Links With Sub-1-V Operation and Per-Pin Clock Recovery," IEEE J. of Solid-State Circuits, vol. 37, No. 11, Nov. 2002.

(Continued)

*Primary Examiner* — Khanh C Tran
*Assistant Examiner* — Qutbuddin Ghulamali
(74) *Attorney, Agent, or Firm* — Mahamedi Paradice Kreisman LLP; Lance M. Kreisman (57) ABSTRACT

A clock recovery circuit includes a first phase detector for measuring the phase difference between a first clock signal from a voltage controlled oscillator (VCO) and a data signal. A phase shifter responsive to a control signal based on this phase difference adjusts the phase of an incoming clock signal to yield a second clock signal. The phase difference between the first clock signal and the second clock signal is measured and the resulting signal is low-pass filtered to derive a control signal for controlling the VCO. The phase locked loop including the VCO filters out jitter.

15 Claims, 7 Drawing Sheets

OTHER PUBLICATIONS

Larsson, Patrick, "A 2-600-MHz CMOS Clock Recovery PLL with Low-V $_{dd}$ Capability," IEEE J. of Solid-State Circuits, vol. 34, No. 12, Dec. 1999.

Lee, Haechang, Chi Ho Yue, Samuel Palermo, Kenneth W. Mai, and Mark Horowitz, "Burst Mode Package Receiver using a Second Order DLL," Center for Integrated Systems, Stanford Univ., Stanford, CA, 2004.

Lee, Thomas H., "A 155-MHz Clock Recovery Delay- and Phase-Locked Loop," IEEE J. of Solid-State Circuits, vol. 27, No. 12, Dec. 1992.

Sidiropoulos, Stefanos and Mark Horowitz, "SA20.2: A Semi-Digital DLL with Unlimited Phase Shift Capability and 0.08-400MHz Operating Range," Center for Integrated Systems, Stanford Univ., Stanford, CA, mos.stanford.edu.\papers\ss_1sscl_97.pdf, Feb. 1997.

Song, Yeo-San and Jin-Ku Kang, "A Delay Locked Loop Circuit With Mixed-Mode Tuning," Dept. of Electrical and Computer Engineering, Inha Univ., Inchon, Korea, Sep. 2000.

Song, Yeo-San et al., A Delay Locked Loop Circuit with Mixed Mode Phase Tuning Technique, IEICE Trans. Fundaments, vol. E83-A, No. 9, Sep. 2000.

Toifl, Thomas, Christian Menolfi, Peter Buchmann, Marcel Kossel, Thomas Morf, Robert Reutemann, Michael Ruegg, Martin Schmatz, and Jonas Weiss, "0.94ps-rms-Jitter 0.016mm$^2$ 2.5GHz Multi-Phase Generator PLL with 360° Digitally Programmable Phase Shift for 10Gb/s Serial Links," 2005 IEEE Int'l Solid-State Circuits Conference.

Wong, Koon-Lun Jackie, Hamid Hatamkhani, and Mozhgan Mansuri, "A 27-mW 3.6-Gb/s I/O Transceiver," IEEE J. of Solid-State Circuits, vol. 39, No. 4, Apr. 2004.

* cited by examiner

LOW JITTER CLOCK RECOVERY CIRCUIT

BACKGROUND OF THE INVENTION

Digital devices as, for example, circuits within a computer, send information to one another by varying a parameter of a signal as, for example, an electrical voltage, during successive intervals set by a clock in the sending device. In a binary system, the sending device sets the signal parameter for each interval either to a first value to denote a 1 or a second value to denote a 0 during each interval. The receiving device takes successive samples of the signal at times corresponding to the intervals in the signal and determines, for each such sample, whether the parameter denotes a "0" or a "1." To do this, the receiving device must have a clock signal synchronized with the intervals in the incoming data signal. If the clock used by the receiving device is out of synchronization with the intervals of the data signal, data can be lost or misinterpreted. To communicate data at high speed, it is desirable to make the bit intervals as short as possible, which, in turn, requires greater precision in the synchronization between the clock signal used by the receiving device and the data intervals of the incoming signal. For example, modern interfacing and communication protocols such as PCI Express, SONET, Infini-Band and XAUI use data intervals on the order of less than one nanosecond and require that the receiving device use a clock synchronized to the data intervals to within fractions of a nanosecond.

DETAILED DESCRIPTION

A clock recovery circuit 100 according to one embodiment of the invention (FIG. 1) incorporates a clock source 102 which, in this embodiment, is a voltage-controlled oscillator or "VCO." VCO 102 is arranged to generate a clock signal referred to herein as a "recovered clock signal", also referred to herein as a "first clock signal." The recovered clock signal may be a single-component system or may include a plurality of components in a predetermined phase relationship with one another as, for example, an in-phase or I component; a Q component in quadrature with the I component; and the compliments I and Q of these components. The VCO may be, for example, a ring oscillator or an oscillator with inductive and capacitive components, commonly referred to as an LC oscillator.

Figure 1:
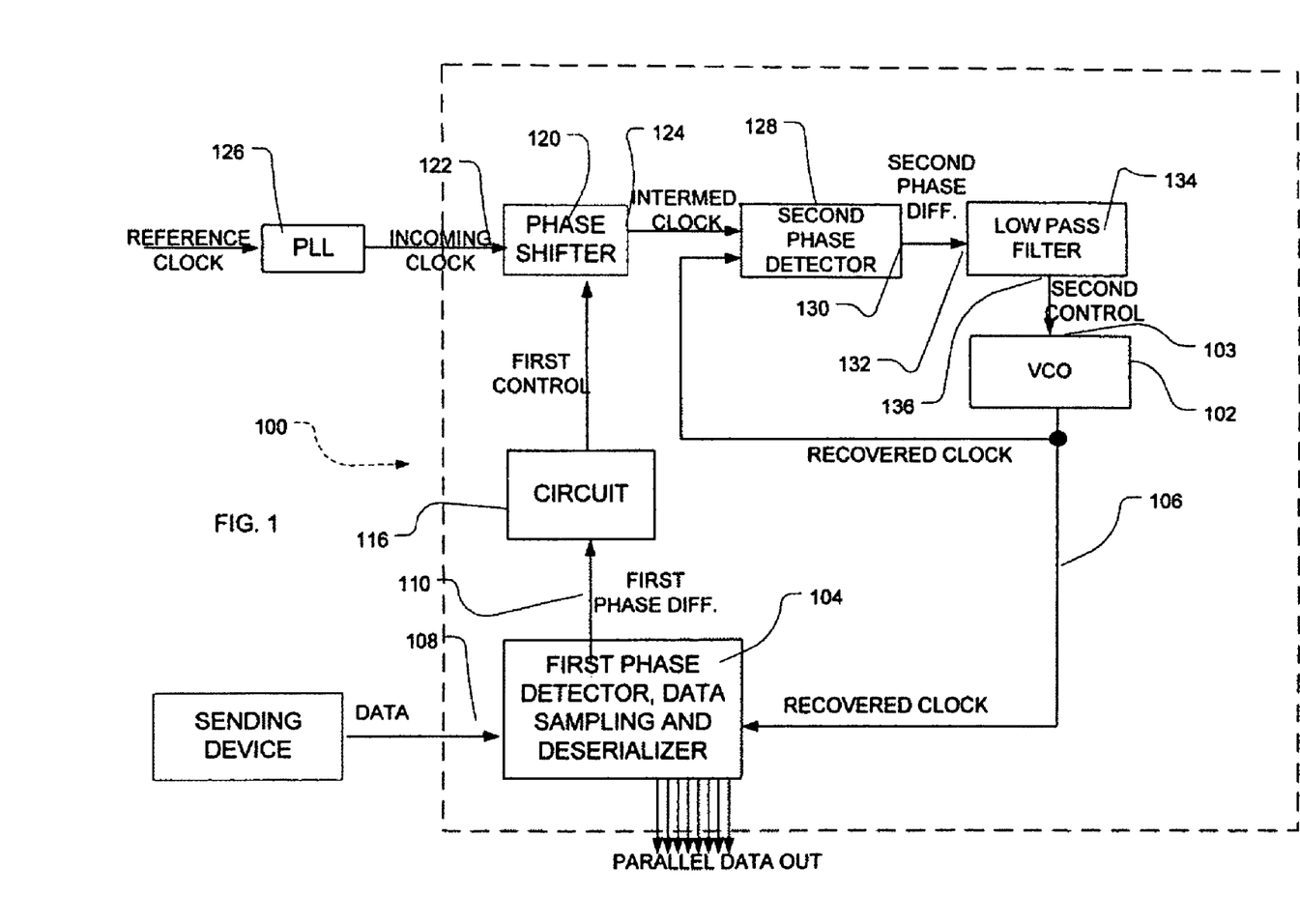
FIG. 1 is a functional block diagram of a clock recovery circuit according to one embodiment of the invention.

The clock recovery system 100 also includes a first phase detector which, in this embodiment, is integrated with a data sampling device and a deserializer in a unit 104. The first phase detector is connected to the clock source 102 by a transmission path 106, so that the first phase detector and deserializer receives the recovered clock signal from the clock source or VCO 102. The first phase detector and deserializer also has a data signal input 108. The unit 104 including the first phase detector is arranged to receive a serial data signal through input 108 and to provide a first phase difference signal on an output 110, such that the first phase difference signal represents the phase relationship between the recovered clock signal supplied through transmission path 106 and the data signal.

Figure 2:
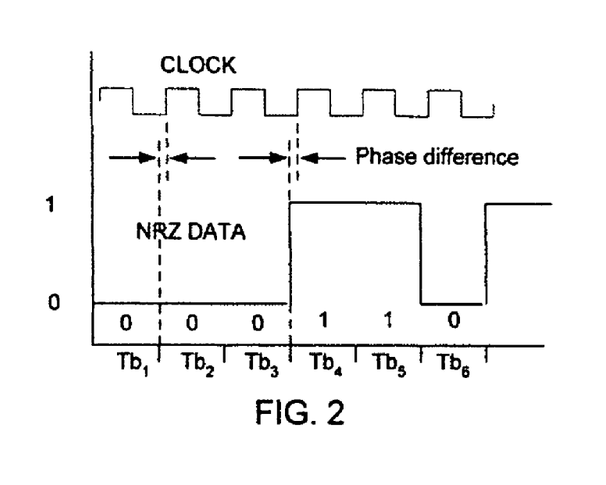
FIG. 2 is a graph depicting a data signal and a clock signal.

As used in this disclosure, the term "data signal" refers to a signal which has defined data intervals and which has a value within each data interval set by the sending device to represent information to be conveyed. For example, the serial binary non-return-to-zero ("NRZ") data signal shown in FIG. 2 has numerous equal data intervals $T_b$, also referred to as "bit intervals." The signal of FIG. 2 is conveying the binary information sequence "000110," and accordingly, the voltage or other parameter of the signal has the value denoting binary 0 in the intervals $T_{b1}$ through $T_{b3}$, the value denoting binary 1 in the intervals $T_{b4}$ and $T_{b5}$ and so on, according to the information to be conveyed. Transitions between 0 and 1 values can occur only at the boundaries between bit intervals, but do not occur at every boundary. For example, at the boundary between bit interval $T_{b3}$ and $T_{b4}$, there is a low-to-high transition; at the boundary between $T_{b2}$ and $T_{b3}$, there is no transition. By contrast, a clock signal, also shown in FIG. 2, is a periodic signal having transitions recurring in every period. The period of the clock signal depicted is equal to one data interval $T_b$. Other implementations use clock signals having plural components, each component having a different phase.

As referred to in the present disclosure, the "phase difference" between a clock signal and a data signal is the time difference between a reference feature of the clock waveform and the nearest boundary between data intervals of the data waveform. In the example of FIG. 2, if the rising edge of the clock signal is selected as the reference feature, the phase difference is proportional to the time delay between the rising edge and the next adjacent transition. As illustrated in FIG. 2, the phase difference exists regardless of whether there is a transition in the data at the particular boundary. However, the phase difference can be measured only at those boundaries where a transition exists. For example, in FIG. 2, the data signal has the same value (low or 0) in $T_{b1}$ and $T_{b2}$; there is no way to detect the boundary between intervals $T_{b1}$ and $T_{b2}$ by examining the value of the data signal. Thus, phase detectors which are capable of detecting a phase difference between a clock signal and a data signal typically include circuits which detect or respond to transitions or edges in the value denoted by the data signal. As used in this disclosure, the term "clock recovery" refers to the process of adjusting the phase of a clock based upon observation of a data signal, as distinguished from observation of another clock signal. The term "clock and data recovery" refers to the process of performing clock recovery and using the recovered clock signal to sample the data signal and thereby recover data values from the data signal. The term "clock recovery circuit" refers to a circuit which is capable of performing clock recovery.

The first phase difference signal may be a binary signal having one value indicating that the clock signal is leading the data signal, and a second value indicating that the clock signal is lagging the data signal. In this case, the digital phase difference signal indicates only the sign of the phase difference, without any information as to its magnitude.

As further discussed below, the unit 104 including the first phase detector, data sampling device and deserializer is also arranged to sample the data signal received through input 108 and to provide the sampled date in parallel form at a parallel data output 112. In one embodiment, the phase detector and deserializer operates on a cycle corresponding to a full byte of data and provides the first phase difference signal once per cycle. If a full byte of data includes N bits, the first phase detector will provide the first phase difference signal cyclically, with a cycle time equal to N bit intervals. In the event that there are no transitions in a particular byte of data, the first phase difference signal may be omitted for that cycle. In other embodiments, the phase detector may operate at a rate corresponding to M bit times (M not equal to N) to either increase or decrease the frequency bandwidth of the first loop.

The first phase difference signal from the first phase detector is conveyed through a circuit 116. Circuit 116 is responsive the first phase difference signal from the first phase detector in unit 104 to derive a first control signal. Circuit 116 may be a digital circuit to provide the first control signal in digital form. It may include a register for storing the value of the first control signal and appropriate circuits for incrementing or decrementing the stored value in response to the first phase difference signal from first phase detector 104, or in response to a function of that signal. In other implementations, circuit 116 may be arranged to filter, or otherwise condition, the first phase difference signal or perform other operations on the first phase difference signal so as to derive the first control signal.

The first phase detector 104 and circuit 116 may be considered as forming a control signal circuit which provides a first phase difference signal representing the difference in phase between the recovered clock signal and the data signal applied to the first phase detector, and which also provides a first control signal which is a function of the first phase difference signal.

The clock recovery circuit further includes a phase shifter having an input 122 for receipt of an incoming clock signal from outside the clock recovery circuit, and also having an output 124. Phase shifter 120 is arranged to shift the phase of an incoming clock signal applied to the input 122 and to provide a phase shifted replica of such signal, referred to herein as an "intermediate clock signal," and also referred to herein as a "second clock signal" at output 124. The phase shift applied by the phase shifter 120 varies in accordance with the first control signal supplied by the control signal circuit including phase detector 104 and circuit 116.

Phase shifter 120 desirably is arranged to provide a full 360° of phase shift. Merely by way of example, the first phase shifter may be a phase interpolator arranged to accept an incoming clock signal in the form of a plurality of components referred to as "phase vectors" in predetermined phase relationship with one another, and form the intermediate clock signal by selecting certain components of the incoming clock signal and mixing these with one another in the appropriate proportions. In a simpler arrangement, phase shifter 120 may be a selector arranged to simply select components from multiple phase vectors in an incoming clock signal and provide one or more of these as the intermediate clock signal. This arrangement allows only for relatively large steps in the phase of the intermediate clock signal. In a further variant, the first phase shifter may include one or more controllable delay lines. A phase shifter which can provide a full 360° phase shift can provide any desired phase angle of the intermediate clock signal relative to the incoming clock signal. The selection or mix of components, or the amount of delay, used to provide a desired phase angle greater than 360°, are equal to those used to provide a phase angle corresponding to the remainder left after dividing the desired phase angle by 360°.

The incoming clock signal may be supplied to input 122 of phase shifter 120 from any source. Desirably, the incoming clock signal has a frequency which is equal or substantially equal to the data signal frequency, or substantially equal to an integral multiple or submultiple of the data signal frequency. Precise equality is not required; as discussed below, the clock recovery circuit can compensate for minor deviations of the frequency of the incoming clock signal. Stated another way, the incoming clock signal may be plesichronous with the data signal rather than synchronous or mesochronous with the data signal. In one common arrangement, the incoming clock signal is generated by a phase lock loop ("PLL") 126 based on a reference clock signal supplied to the phase lock loop. PLL 126 may multiply or divide the frequency of the reference clock signal to form the incoming clock signal, and may also generate the incoming clock signal with plural phase vectors or components.

As further discussed below, the intermediate clock signal produced by phase shifter 124 need not include the same number of components or phase vectors required in the recovered clock signal ultimately supplied by VCO 102 on path 106. In some embodiments, for example, the intermediate clock signal includes only one or two components as, for example, a single differential pair, i.e., two complimentary components, or a single component.

The output 124 of phase shifter 120 is connected to one input of a second phase detector. Another input of second phase detector 128 is connected to the output of VCO 106 and through signal path 106 and receives one or more components of the recovered clock signal from the VCO. The second phase detector may be a relatively simple device, inasmuch as it only is required to compare the phases of two clock signals, and therefore need not detect transitions in a data signal. The second phase detector is arranged to produce a second phase difference signal at an output 132, which is connected to an input 132 of a low-pass filter 134. Low-pass filter 134 is arranged to pass low frequency components of the second phase difference signal below a predetermined cutoff frequency and reject higher frequency components of the second phase difference signal, and thereby form a second control signal at output 136. This second control signal is connected to the control input 103 of VCO 102.

The clock recovery circuit as a whole thus includes two distinct control loops. A first or outer loop includes the first phase detector 104, first filter 116, and phase shifter 120. A second or inner loop phase-locked loop includes the VCO 102, second phase detector 128 and low-pass filter 134. The first or outer loop controls the intermediate clock signal and tends to synchronize the intermediate clock signal to the data signal. The second or inner phase locked loop tends to synchronize the recovered clock signal to the intermediate clock signal, and hence synchronized to the data signal. Stated another way, the outer loop adjusts the phase of an input signal to the inner phase-locked loop.

The two loops in combination provide results superior to those which could be achieved by either loop alone. Because the outer loop can provide a full and continuous range of phase difference between the incoming clock signal and the intermediate clock signal, it can compensate for minor differences in frequency between the incoming clock and the data signal, by continually advancing or retarding the phase of the intermediate clock signal. Further, the use of a digital control signal and first or outer-loop phase detector with cyclical, byte-wise operation facilitates the use of known techniques such as partial response decision feedback equalization, also referred to as "PRDFE," which compensate for intersymbol interference an improve the accuracy of the data sampling device and phase detector.

However, the outer loop has an appreciable loop delay. As used in this disclosure, the term "loop delay" refers to the delay between a change in the phase difference to be corrected by a control loop and a change in the clock signal response to such change. In the case of the outer loop, the loop delay is the delay between a change in the phase difference between the recovered clock signal and the data signal and the resulting change in the intermediate clock signal provided by phase shifter 124. The first phase detector 104 may operate cyclically, and hence introduces a loop delay equal to about 1 cycle time. Additionally, the digital logic elements in the first phase detector, discussed further below, and any digital logic elements in circuit 116, may introduce additional loop delay.

Figure 3:
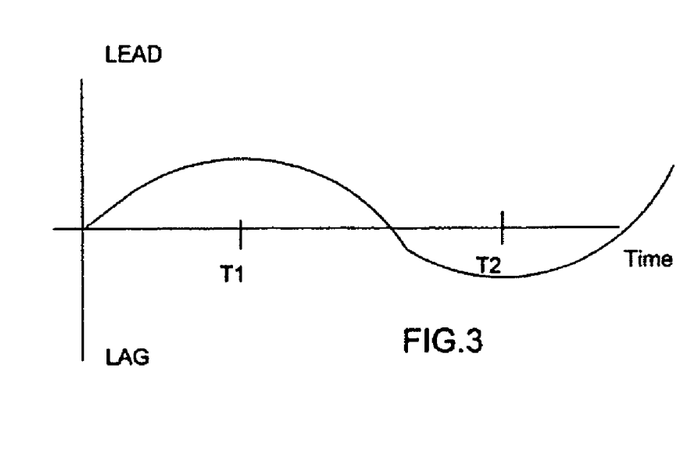
FIG. 3 is a graph depicting a phase relationship.

Loop delay can cause a clock recovery circuit to make inappropriate corrections in the phase of the recovered clock signal. For example, as shown in FIG. 3, the incoming data signal may be subject to variations in phase with time, commonly referred to as phase noise jitter, so that the data signal first leads and then lags the recovered clock signal. A clock recovery circuit with loop delay may detect the lead at time T1 and attempt to advance the phase of the recovered clock signal to compensate for this lead. However, because of the loop delay, the correction is not made until time T2. At this time, the data signal is lagging the recovered clock signal. Therefore, advancing the phase of the recovered clock signal at time T2 aggravates the phase difference between the recovered clock signal and the data signal, rather than correcting it. This effect, if left uncorrected, can cause the phase of the recovered clock signal to continually swing between leading and lagging the received data signal, and hence can introduce jitter into the recovered clock signal. This effect may be particularly pronounced where the phase of the received data signal changes at particular frequencies. Pronounced sensitivity to phase changes in the received data signal at a particular frequency is referred to herein as "jitter peaking."

Moreover, the binary phase difference signal supplied by the digital phase detector also tends to introduce jitter even where the received data signal has a constant phase. Noise in the received data signal can cause lead and lag detection errors, so that the binary phase difference signal indicates that the recovered clock signal is leading the data signal when it is actually lagging or vice-versa. Errors of this type are more likely to occur when the recovered clock signal is close to an exact phase lock with the received data signal. Further, the first control loop, with digital control of the phase shifter, typically changes the phase delay stepwise. If the recovered clock signal is lagging the received data signal before such a step, it may lead after such a step. The severity of this alternating lead and lag effect is related to the size of the stepwise adjustment in the phase delay; larger step sizes tend to aggravate this effect. However, the maximum rate at which the control loop can change the phase of the clock signal in response to a real change in the phase of the data signal, referred to herein as the "slew rate" of the control loop, is directly related to the step size. Thus, there is a tradeoff between slew rate and the alternating lead and lag effect.

Figure 4:
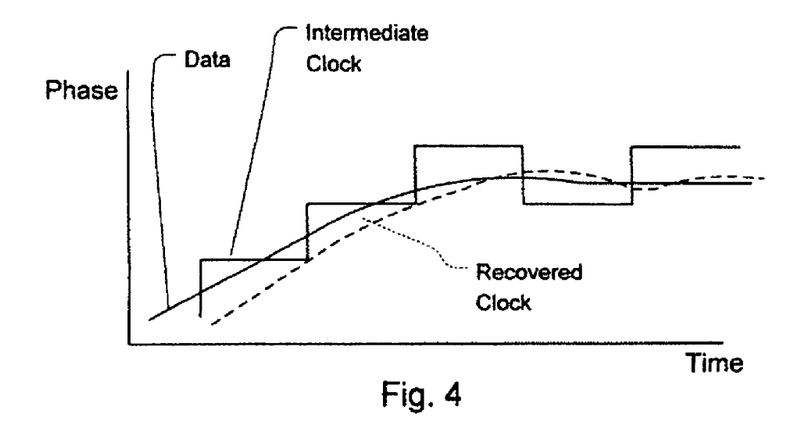
FIG. 4 is a graph depicting certain idealized phase relationships between certain signals in the circuit of FIG. 1.

The inner phase-locked loop tends to alleviate this tradeoff and to compensate for jitter of the intermediate clock signal relative to the data signal. Due to the low-pass filter 134, the VCO tends to settle asymptotically towards the phase of the intermediate clock signal. Thus, as seen schematically in FIG. 4, where the intermediate clock signal is ultimately leading and lagging the phase of the data signal, the recovered clock signal will lead and lag to a lesser degree than the intermediate clock signal. Stated another way, the low-pass filter in the phase-lock loop filters out jitter caused by the first or outer loop. As such jitter has a fundamental frequency of about $1/Tc$, where Tc is the cycle time of the first phase detector, the cutoff frequency of the low-pass filter desirably is less than about $1/Tc$. Stated another way, the bandwidth of the low-pass filter desirably is less than about $1/Tc$. The cutoff frequency of the low pass filter may be less than $1/Td$, where Td is the loop delay of the first or outer loop. The cutoff frequency of the low pass filter may be substantially less than $1/Tc$ or $1/Td$ as, for example, 0.1 times $1/Tc$ or $1/Td$, or less. The cutoff frequency of the low pass filter should be above the expected frequency of jitter in the data signal. The low-pass filter 134 in the inner phase-locked loop also tends to compensate for non-linearity in the outer loop.

Figure 5:
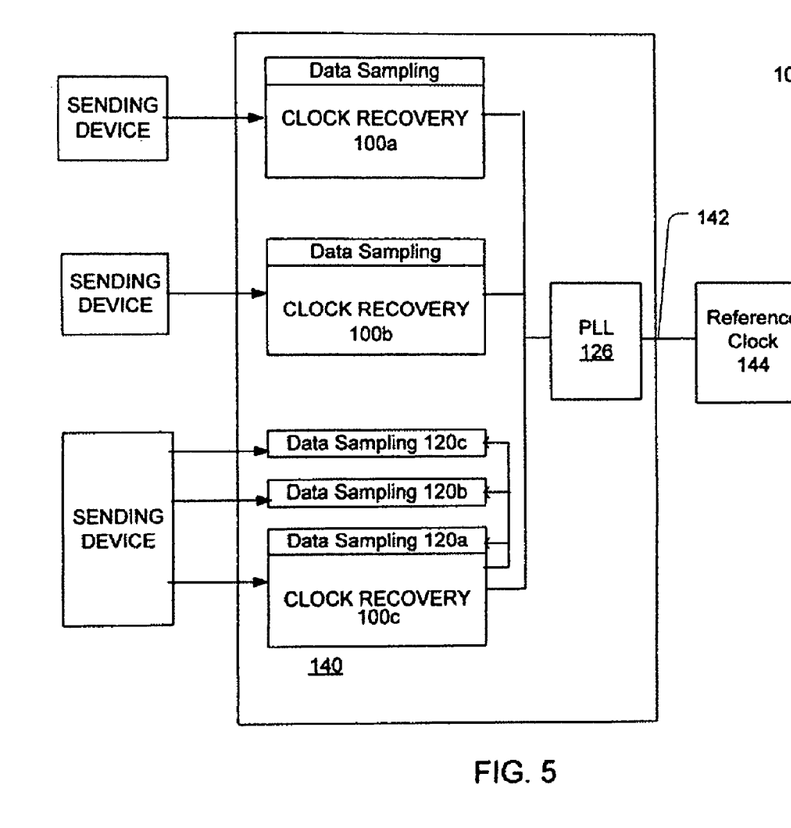
FIG. 5 is a block diagram of an integrated circuit according to a further embodiment of the invention.

In various embodiments, the clock recovery circuit as depicted above with reference to FIG. 1 can provide other advantages. As shown in FIG. 5, a single PLL 126 may supply an incoming clock signal to several clock recovery circuits 100a, 100b, 100c, each configured as discussed above with reference to FIG. 1. The clock recovery circuits 100 and phase lock loop 126 are formed in a single monolithic integrated circuit 140. PLL 126 may be linked to an off-chip connection 142 outside of the monolithic circuit for receipt of the reference clock. PLL 126 may incorporate inductive and capacitive components. However, because only one such PLL is required for several clock recovery circuits, the problems of false phase locking between closely-spaced PLLs incorporating inductive components do not occur. In certain embodiments, the VCOs 102 (FIG. 1) of the individual clock recovery circuits do not incorporate inductive components, and therefore are not susceptible to false phase locking, even where the clock recovery circuits are closely-spaced on the integrated circuit. PLL 126 will effectively filter out jitter in the reference clock. Moreover, using a single PLL 126 for multiple clock recovery circuits minimizes the power consumption per clock recovery circuit, and hence the power consumption per data signal received, also referred to as "power per lane."

Power per lane is further minimized by using only one phase shifter in each clock recovery circuit. Moreover, because the intermediate clock signal supplied by the phase shifter need not incorporate numerous phase vectors, the phase shifter 120 can be a relatively simple device with low power consumption.

In the arrangement shown in FIG. 1, the clock recovery circuit provides the recovered clock signal to only one data sampling device, and the data sampling device is integrated with the digital phase detector and deserializer. However, where several data sampling devices receive plural data signals and the data intervals of these plural signals are synchronized with one another, the recovered clock signal from a single clock recovery circuit can be provided to plural data sampling devices which receive these data signals. For example, in FIG. 5, the recovered clock signal from clock recovery circuit 100c is provided to data sampling devices 120a, 120b and 120c.

Also, the data sampling device, deserializer and digital phase detector need not be integrated with one another but instead may be separate circuit elements. Indeed, it is not essential to provide a data sampling device connected to the data signal input of the clock recovery circuit. In the arrangement of FIG. 5, data sampling device 120a may be omitted. In this case, the information conveyed by the signal supplied to clock recovery circuit 100c is not recovered, but the information sent to data sampling units 120c and 120b is recovered. In such an arrangement, the signal received by the clock recovery circuit 100c may be either a data signal or a clock signal with a periodic pattern of 1's and 0's. Stated another way, a clock recovery circuit 100 which is capable of performing clock recovery from a data signal typically can also work with a clock signal.

The components depicted in FIG. 1 are shown in functional, block diagram form. The same physical elements which are used to constitute one component may also serve as physical elements of another functional component. For example, a register or other logic elements in circuit 116 may be integrated in the digital logic of first phase detector 104.

Figure 6:
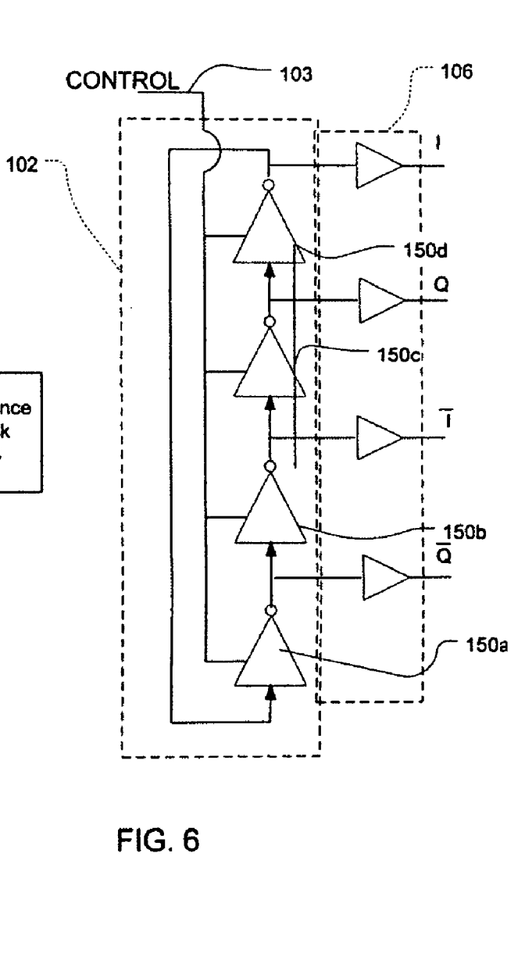
FIG. 6 is a simplified circuit diagram of an oscillator used in the circuit of FIG. 1.

As best seen in the simplified circuit diagram (FIG. 6), the VCO 102 may be in the form of a ring oscillator which includes a plurality of delay elements, which, in this embodiment, are inverters 150a-150d. The inverters 150a-150d are arranged in an ordered series from a lowest-ordered inverter 150a to a highest-ordered inverter 150d, with the output of each inverter connected to the input of the next higher-ordered inverter. For example, the output of lowest-ordered inverter 150a is connected to the input of the next higher ordered inverter 150b, and so on. The output of the highest-ordered inverter 150d is connected to the input of the lowest-ordered inverter 150a. The inverters are provided with a common supply voltage from the control signal input 103 of the VCO, so that the delay time within each inverter will vary in accordance with the voltage applied. In operation, a signal propagates continually through the circuit at a frequency which depends on the signal delay within each inverter. The recovered clock signal can be taken from one or more of the outputs of the inverters. Thus, a recovered clock signal having two or more components in predetermined phase relationship with one another can be provided simply by taking signals from two or more of the outputs as, for example, the I, Q, I and Q components taken from four outputs. Although each inverter is shown as having only one output and only one input in FIG. 6, in practice, the inverters may be arranged to process a signal in the form of a differential pair, such that each inverter has two inputs and two outputs.

The inverters constituting the ring oscillator can be arranged to provide signal components with appreciable power so that these signal components can be directed to the devices which use the signal components without extensive amplification. This, in turn, avoids the power consumption and space requirements associated with a cascade of numerous buffer amplifiers. Moreover, it minimizes the fluctuations in the transmission delay through a cascade of buffer amplifiers in the transmission path. Such fluctuations can be caused, for example, by power supply noise, and would result in jitter in the recovered clock signal. The output of the VCO may be connected to the devices which use the recovered clock signal through a transmission line 106, which includes only one or two stages of buffer amplification per component. In the embodiment of FIG. 1, the first and second phase detectors are the devices which use the recovered clock signal.

Figure 7A:
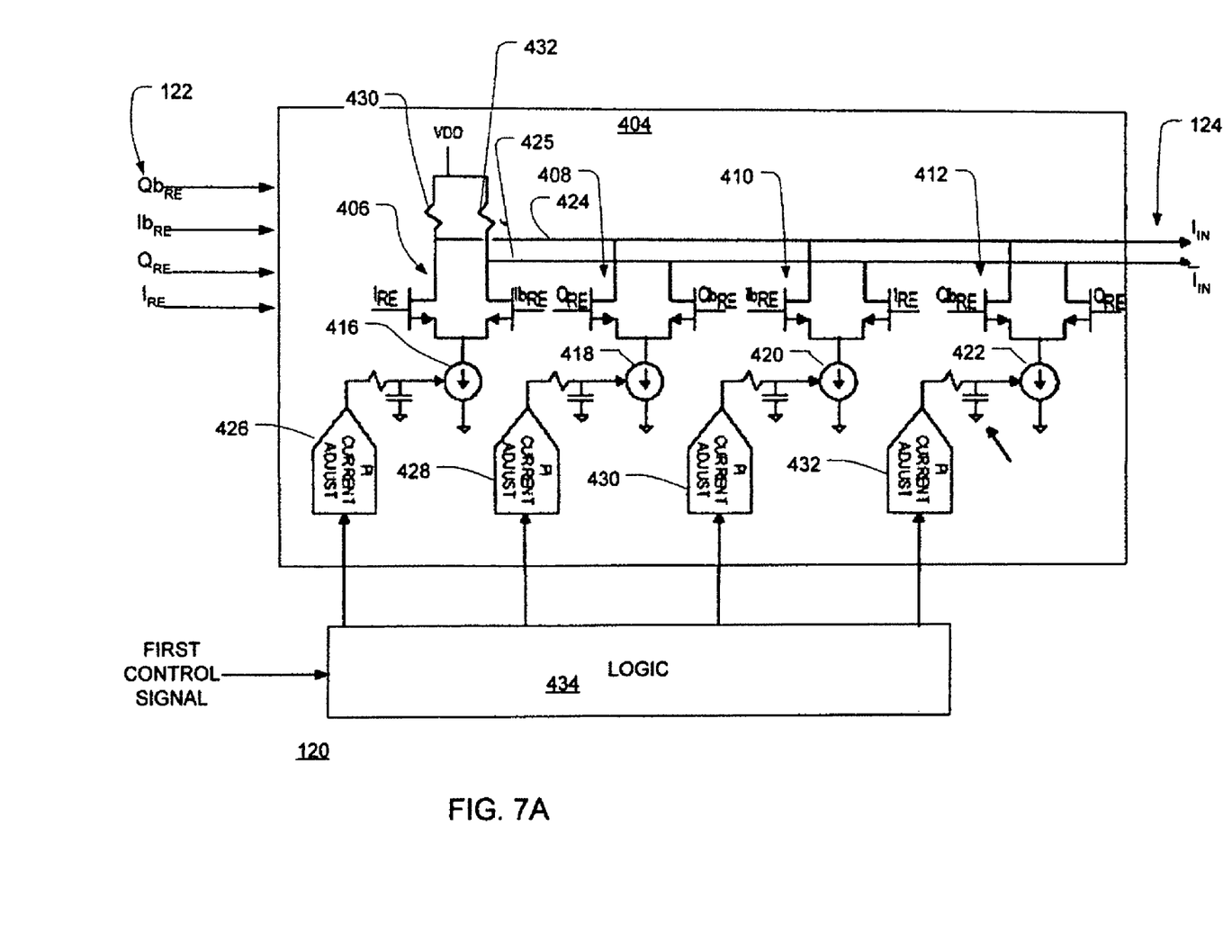
FIG. 7A is a schematic diagram of a phase interpolator used in the circuit of FIG. 1.

One implementation of the phase shifter 120 shown in FIG. 1 is depicted in greater detail in FIG. 7A. As shown in FIG. 7A, the input 102 of the first phase shifter is arranged to receive an incoming clock signal in the form of $I_{RE}$ (0°), $Q_{RE}$ (90°), $Ib_{RE}$ (180°) and $Qb_{RE}$ (270°) phase signals or components. These components are connected to the gates of four differential pairs of transistors 406, 408, 410 and 412 of a combining circuit 404, also referred to as a phase interpolator.

The connection paths between input 102 and the gates of the transistors are omitted for clarity of illustration in FIG. 7A. Pair 406 has the source connections of the two transistors connected in common through a current source 416. The drain of one transistor is connected to a first output line 424. The drain of the opposite transistor in the same pair 406 is connected to an opposite output line 425. Pairs 408, 410 and 412 are connected in the same manner through current sources 418, 420 and 422. The output lines 424 and 425 are connected to a voltage source through load resistors 430 and 432. The components $Ib_{RE}$, $I_{RE}$, $Q_{RE}$, and $Qb_{RE}$, derived from the reference clock signal, are connected to the gates of the various pairs. For example, pair 406 has one gate connected to component $I_{RE}$ and the other gate connected to the inverse component $IB_{RE}$. Accordingly, current flowing through source 416 will appear as a voltage on lines 424 and 426 having a phase associated with component $I_{RE}$. Stated another way, the connected signals $I_{RE}$ and $Ib_{RE}$ at pair 406 constitute a first or 0° signal which tends to contribute a component at 0° phase angle relative to $I_{RE}$. In exactly the same manner, signals $Q_{RE}$ and $Qb_{RE}$ are applied to differential pair 408 and tend to contribute a component 90° out-of-phase with $I_{RE}$. Pair 410 receives signals $Ib_{RE}$ and $I_{RE}$, but the connections of these signals are reversed relative to the connections used with pair 406, so that current flowing through 410 and the associated current source 420 contributes a component 180° out-of-phase with $I_{RE}$ to the signal on line 424. Likewise, pair 412 receives components $Qb_{RE}$ and $Q_{RE}$, but has connections reversed relative to pair 408, so that current flowing in pair 412 and source 422 will contribute a component 180° out-of-phase with $Q_{RE}$ and, hence, 270° out-of-phase with $I_{RE}$. All of these components are summed by the action of resisters 430 and 432 to provide an intermediate signal component $I_{IN}$ and its complement $\bar{I}_N$ on lines 424 and 425 respectively, which constitute the output 124 of the phase shifter.

Current sources 416, 418, 420 and 422 are controlled by digital-to-analog converters 426, 428 430 and 432 respectively, which supply analog signals to the current sources through resistor capacitor networks. Logic circuit 434 receives the first control signal from filter 116 (FIG. 1) indicating the desired phase shift and supplies a value to each digital-to-analog converter 426-432.

Figure 7B:
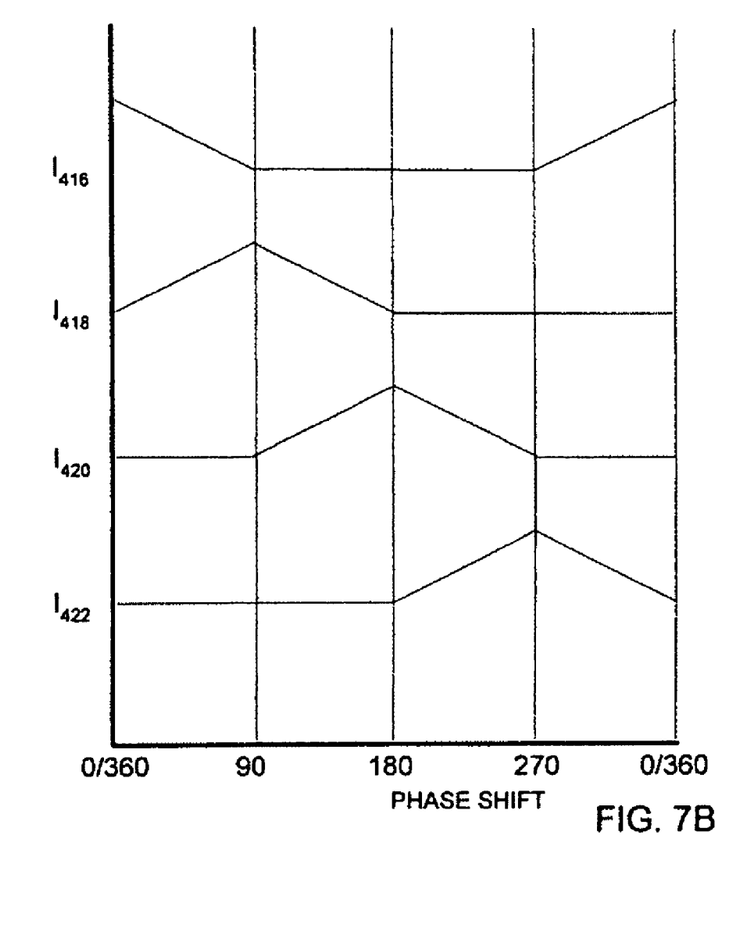
FIG. 7B is a graph depicting certain current flows in the phase interpolator of FIG. 7A.

The currents produced by sources 416-422 represent coefficients to be multiplied with the various phase signals as discussed above. For example, the current $I_{418}$ provided by source 418 represents the coefficient to be multiplied with the 90° phase signal at pair 408. For a desired phase shift between 0° and 180°, the logic unit 434 supplies digital-to-analog converter 428 with a value which is at a maximum for a desired phase shift of 90° and which decreases progressively as the difference between the desired phase shift increases. As shown in FIG. 7B $I_{418}$ and hence the component applied by pair 408 associated with the 90° phase signal is at a maximum when the desired phase shift equals 90° and decreases progressively as the desired phase shift approaches 0° or 180°. For desired phase shift outside of the 0° to 180° domain, logic circuit 434 supplies a value of zero to digital-to-analog converter 428, and hence, $I_{418}$ and the current passing through pair 408 is 0 and the 90° phase signal ($Q_{RE}$ and $Qb_{RE}$, as applied to pair 408) is deselected so that it does not contribute to the intermediate clock signal. The logic circuit 434 operates in exactly the same way with regard to each of the other digital-to-analog converters 426, 430 and 432, using different domains, so that the 0° phase signal at pair 406 is selected and applied with a non-0 coefficient $I_{416}$, over the domain of 270-90°; the 180° phase signal at pair 410 is selected and applied with a non-zero coefficient $I_{420}$ over the domain 90°-

270°, whereas the 270° phase signal at pair 412 is selected and applied with a non-zero coefficient $I_{422}$ over the domain 180°-360°. Thus, for any given phase shift specified by the digital control signal, only two of the differential pairs 406-412 and only two phase signals are selected and active. In the special case where the specified phase shift is exactly 0°, 90°, 180° or 270°, only one differential pair is active, and only one phase signal is selected. The resultant signal on lines 424 and 425 constitutes the output 106 of the first phase shifter.

Figure 8:
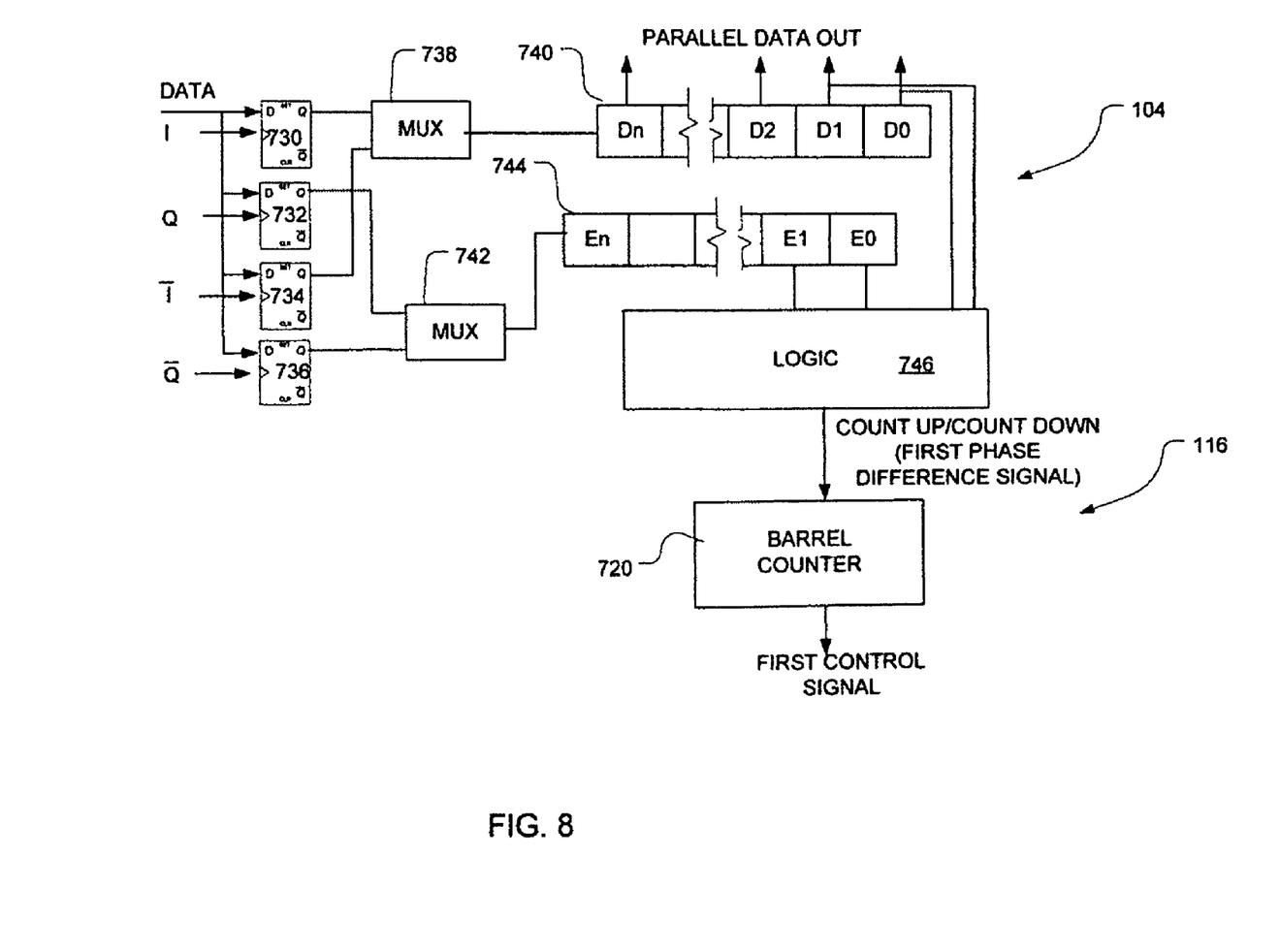
FIG. 8 is a block diagram of a phase detector and deserializer used in the circuit of FIG. 1.
Figure 9A:
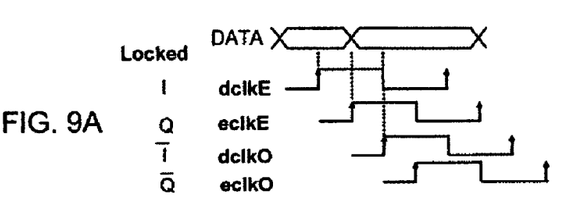
FIGS. 9A-9D are graphs depicting certain phase relationships in the phase detector of FIG. 8.

An implementation of the unit 104 (FIG. 1) including the data sampling device, deserializer and first phase detector is shown in FIG. 8, together with an implementation of circuit 116. This implementation uses a recovered clock signal having components I and Q in quadrature and their complements $\bar{I}$ and $\bar{Q}$, as depicted in FIG. 9A. Each component has a period equal to two data intervals. In the ideal locked condition shown in FIG. 9A, components I and $\bar{I}$ are aligned in the centers of successive data intervals, whereas components Q and $\bar{Q}$ are aligned with the boundary or edges between successive data intervals. The serial data input is connected to flip-flop 730, clocked by I; to flip-flop 732, clocked by Q; to flip-flop 734 clocked by $\bar{I}$; and to flip-flop 736, clocked by $\bar{Q}$. Accordingly, in the locked condition shown in FIG. 9A, flip-flops 730 and 734 will sample the serial data signal in alternate data intervals, referred to herein as "even" and "odd" data intervals, whereas flip-flops 732 and 736 will sample the serial data signal at alternate even and odd boundaries between data intervals. Thus, the components I and $\bar{I}$ can be referred to as even and odd data clocks, whereas components Q and $\bar{Q}$ can be referred to as even and odd edge clocks.

The outputs of flip-flops 730 and 734, clocked by the data clocks, are connected through a multiplexer 738 to the input of a shift register 740, referred to herein as the data register. Thus, as the flip-flops and multiplexer operate, 1 or 0 values from flip-flops 730 and 732, representing samples taken during successive even and odd data intervals, will be clocked into register 740. The outputs of flip-flops 732 and 736, clocked by the edge clocks, are connected through another multiplexer 742 to a shift register 744, referred to herein as the edge register. Each shift register is arranged to hold n bits, where n is equal to the number of bits in a byte of parallel data. Thus, after n data intervals, data register 740 will hold data as shown in FIG. 8, with an even bit D0 representing the sample taken during a first, even data interval in the first position, an odd bit D1 representing the sample D1 taken during the next, odd data interval, and so on. Similarly, the first position in edge register 744 will hold a first, even bit E0 representing the sample taken at the boundary between the first and second data intervals, i.e., at the boundary between the data intervals represented by bits D0 and D1. Likewise, the second position in edge register 744 will hold an odd bit E1 representing the sample taken at the boundary between the data intervals represented by bits D1 and D2, and so on.

Data register 740 is arranged to supply all of the bits together, as the parallel data output of the deserializer. The data and edge registers 740 and 744 also are connected to a logic circuit 746. Logic circuit 746 is arranged to perform an exclusive or (XOR) operation between each data bit in data register 740 and the next succeeding bit in the data register to derive a transition detect signal. The logic circuit 746 is also arranged to perform an XOR operation between each data bit in data register 740 and the corresponding edge bit in register 744 to provide an early/late signal. For example, the XOR of D0 and D1 provides a transition detect signal associated with D0, whereas the XOR of D0 and E0 provides an early/late signal associated with D0. Logic circuit 746 is arranged to compute a count value for each byte equal to the number of early/late signals for that byte having value 1 minus the number of early/late signals which have value 0. However, the logic circuit is arranged to exclude from the count the early/late signal associated with each data bit if the transition detect signal associated with that data bit is 0. A positive count value indicates that the clock is late relative to the data signal, whereas a negative count value indicates that the clock is early relative to the data signal. For each byte, logic unit 746 supplies a count up signal if the count is positive; a count down signal if the count is negative, or neither if the count is zero. These signals constitute the first phase difference signal.

Figure 9B:
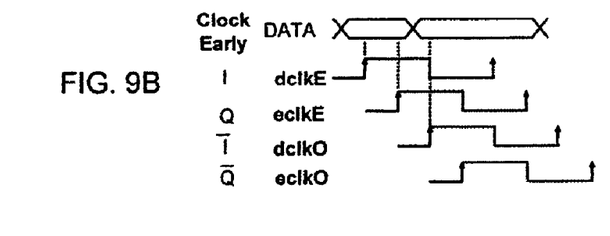
Figure 9C:
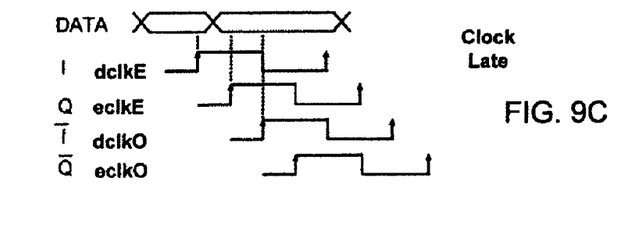
Figure 9D:
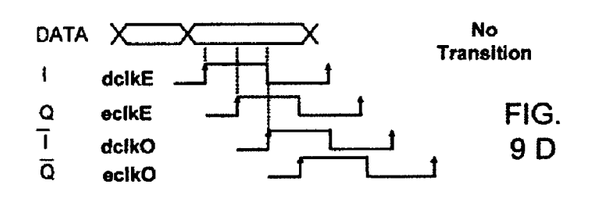
Figure 10:
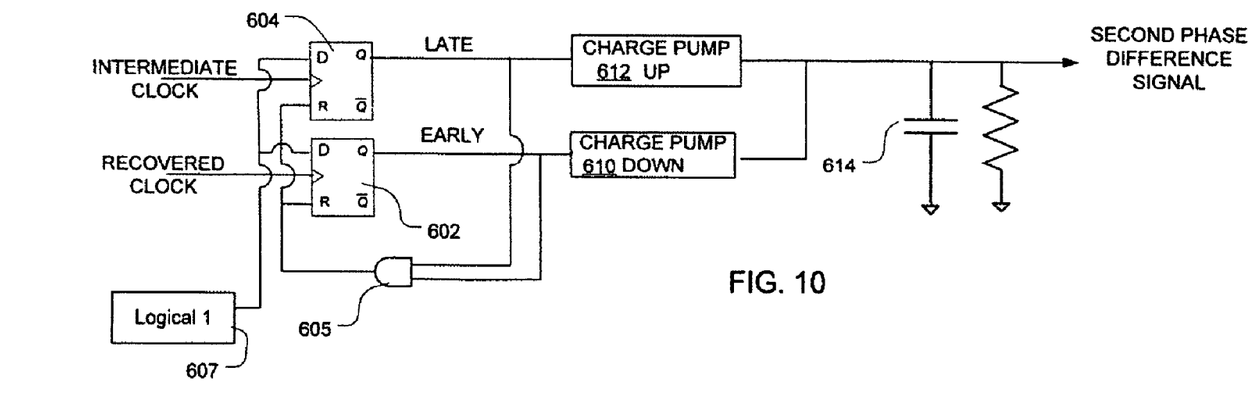
FIG. 10 is a schematic diagram of another phase detector used in the circuit of FIG. 1.

The operation of the digital phase detector of FIG. 10 can be better understood with reference to FIGS. 9A-9D. In a perfectly locked condition (FIG. 9A), each edge sample represented by the bits in the edge register is taken precisely at the boundary between data intervals. The voltage used to represent digital 1 or 0 has an indeterminate value, somewhere between the high value representing 1 and the low value representing 0. In an ideal system in this perfect lock condition, the voltage is exactly midway between the high value representing 1 and the low value representing 0. Thus, when flip-flop 732 or flip-flop 736 samples the signal, the probability that the digital value output by the flip-flop will be 1 is equal to the probability that the value will be 0. Therefore, the number of 0 early/late signals generated by the logic circuit will be equal to the number of 1 early/late signals.

Where the clock is early (FIG. 9B), each edge bit represents a sample taken during the immediately preceding data interval, rather than at the boundary or edge between data intervals. Therefore, each edge bit in register 744 will have the same value as the corresponding data bit in register 740, and hence each early/late signal will be 0. Where the clock is late (FIG. 9C), each edge bit represents a sample taken during the immediately succeeding data interval, rather than at the boundary between data intervals. If there is a transition in the data between these intervals, the edge bit will have a value different from the corresponding data bit, and the early/late signal will be 1.

If there is no transition between two successive data intervals, so that the data bits are the same, the edge bit will have the same value as the data bits regardless of whether the clock is early or late, and the early/late signal will be 0. However, in this case, the transition signal will also be 0 and the early/late signal is ignored.

The characteristics of the sending device and transmission line remain can change depending on the symbols included in the data signal, i.e., the sequence of digital 1's and digital 0's transmitted, causing distortion in the data signal referred to as "intersymbol interference." This effect causes changes in the actual high voltage observed at the receiving device for digital 1 and the actual low value representing digital 0. If the high voltage which represents digital 1 rises slightly due to this effect, then, in the perfectly locked condition of FIG. 9A, the actual voltage will be greater than the midpoint between the nominal high voltage and nominal low voltage. Thus, the probability that the flip-flops 732 and 736 will interpret the signal as a digital 1 will be greater than the probability that the flip-flops will interpret the signal as a digital 0. This can lead to inaccuracy in the phase difference signal, which in turn tends to cause jitter in the recovered clock signal. As discussed above, the inner control loop including filter 134 and VCO 102 filters out such jitter, so that the clock recovery circuit as a whole is resistant to jitter induced by intersymbol interference. Moreover, known techniques for suppressing the effects of intersymbol interference can be employed in conjunction with the clock recovery circuit.

In this implementation, the circuit 116 which derives the first control signal from the first phase difference signal includes a barrel counter 720 connected to receive the count-up and count-down signals from logic unit 746. Counter 720 holds a count value; it increments the count by a preselected increment for each count-up signal and decrements the count by the same increment for each count-down signal. Counter 720 counts along a circular scale corresponding to 360°. Thus, assuming that the barrel counter is operating with a 1° increment and the current count is 359°, the count will be reset to 0 if a count-up signal is received. Similarly, if the count is currently 0°, the count will be reset to 359° if a count-down signal is received. The count value is output by the barrel counter, and constitutes the first control signal. The barrel counter will retain a fixed value for the first control signal, even during a prolonged absence of transitions in the data signal and prolonged absence of count-up and count-down signals.

The particular implementation shown in FIG. 8 can be varied. For example, the components of the digital phase detector may be replaced by other circuits which perform the equivalent operation of edge detecting the data signal and multiplying the clock signal by the edge detection signal. See "Monolithic Phase-Locked Loops And Clock Recovery Circuits—Theory And Design," Razavi, ed., February, 1996, pp. 33-35.

One implementation of the second phase detector 128 is shown in FIG. 10. The phase detector includes two flip-flops 602 and 604. Flip-flop 602 is synchronously set by the rising edge of recovered clock component I, whereas flip-flop 604 is synchronously set by the rising edge of intermediate clock signal component $I_{IN}$. The Q outputs of both flip-flops are connected to an AND gate 605. Both flip-flops are immediately reset by the output of AND gate 605. The D inputs of the flip-flops are connected to a source 607 of logical 1 voltage. The Q output of flip-flop 602 is connected to a charge pump 610 which acts to reduce the voltage on a capacitor 614 when the Q output of flip-flop 602 is high. The Q output of flip-flop 604 is connected to a charge pump 612, which acts to increase the voltage on the capacitor when the Q output of flip-flop 604 is high.

If the recovered clock signal is exactly in lock with the intermediate clock signal, the outputs of both flip-flops will go high simultaneously, and both charge pumps will operate for equal periods during every cycle of the clock signals. If the recovered clock signal is leading the intermediate clock signal, the output of flip-flop 602 will go high before the output of flip-flop 602, and accordingly charge pump 610 will operate for a longer time than charge pump 612. This reduces the charge on the capacitor. If the recovered clock signal is lagging, the opposite will occur; charge pump 612 will operate for a longer time, thereby increasing the charge on the capacitor.

Numerous variations and combinations of the features discussed above can be used. For example, the second or inner loop may be a delay lock loop rather than a phase lock loop. In such an embodiment, the source of the recovered clock signal is a controllable delay line connected to the incoming clock signal, and controlled by the second control signal. This delay line is substituted for VCO 102.

The clock recovery circuit can be used with multilevel data signals, i.e., data signals in which the signal within each data interval may have any one of three or more discrete values.

As these and other variations and combinations of the features discussed above can be utilized without departing from the invention as defined by the claims, the foregoing description of the embodiments should be taken by way of illustration rather than by way of limitation of the invention as defined by the claims.

The following paragraphs of the specification refer to certain claims set forth below, and can best be understood with reference to such claims.

A. A unit comprising a monolithic integrated circuit including a plurality of clock recovery circuits as claimed in claim 1 or claim 8.

B. A unit as described in paragraph A above, wherein the integrated circuit further includes a clock signal supply circuit connected to the phase shifters of the plurality of clock recovery circuits for supplying the input clock signal.

C. A unit as described in paragraph B above, wherein the clock signal supply circuit includes a phase lock loop having one or more inductive components.

D. A unit as described in paragraph C above, wherein the phase lock loop includes a reference signal input for accepting a reference clock signal and the phase lock loop is constructed and arranged to supply the input clock signal at a frequency different from the frequency of the reference clock signal.

E. A unit as described in paragraph B above, further comprising a plurality of data sampling circuits, each the data sampling circuit being operative to clock in data in accordance with a first clock signal from one of the clock recovery circuits.

F. A unit as described in paragraph E above, wherein the plurality of data sampling circuits includes a number of data sampling circuits equal to the number of the clock recovery circuits, and wherein each the clock recovery circuit is associated with one of the data sampling circuits.

G. A unit as described in paragraph F above, wherein the first phase detector of each of the clock recovery circuit includes one or more components of the data sampling circuit associated with that clock recovery circuit.

H. A tool comprising an information-bearing medium having computer-readable information thereon, the computer-readable information being configured to actuate a circuit-forming apparatus to form a cell of an integrated circuit including a clock recovery circuit as claimed in claim 1 or claim 8.

I. A method of clock recovery comprising:
  (a) operating a clock supply circuit to provide a first clock signal;
  (b) comparing the phase of the first clock signal with the phase of a data signal to provide a first phase difference signal representing a phase difference between the first clock signal;
  (c) providing a first control signal which is a function of the first phase difference signal;
  (d) altering the phase of an incoming clock signal responsive to the first control signal to thereby provide an second clock signal;
  (e) comparing the phase of the first clock signal with the second clock signal to thereby provide a second phase difference signal;
  (f) providing a second control signal which is a function of the second phase difference signal, the step of providing the second control signal including low-pass filtering the second phase difference signal; and
  (g) controlling the clock supply circuit to advance or retard the first clock signal responsive to the second control signal.

J. The method as described in paragraph I above, wherein the step of providing a first control signal includes integrating the first phase difference signal.

K. The method as described in paragraph I above, wherein the step of operating a clock supply circuit includes operating an oscillator and wherein the step of controlling the clock supply circuit includes adjusting the frequency of operation of the oscillator.

L. The method as described in paragraph K above, wherein the oscillator is a voltage-controlled ring oscillator and the step of adjusting the frequency of operation includes varying a supply voltage applied to the ring oscillator.

M. The method as described in paragraph L above, further comprising the step of driving a data sampling circuit with the first clock signal to sample the data signal.

N. The method as described in paragraph M above, wherein the step of driving a data sampling circuit includes routing the first clock signal from the ring oscillator to the data sampling circuit through no more than two amplification stages.

The invention claimed is:

1. A clock recovery circuit comprising:
  (a) a clock supply circuit for generating a first clock signal;
  (b) a control signal circuit including a first phase detector connected to the clock supply circuit for providing a first phase difference signal representing a difference in phase between the first clock signal and a data signal applied to the first phase detector, the first control signal circuit providing a first control signal which is a function of the first phase difference signal;
  (c) a phase shifter, the phase shifter being operative to apply a phase shift to an input clock signal and thereby provide a second clock signal and to vary the phase shift responsive to the first control signal;
  (d) a second phase detector connected to the clock supply circuit and to the first phase shifter for providing a second phase difference signal representing a difference in phase between the second clock signal and the first clock signal and
  (e) a filter connected to the second phase detector for filtering the second phase difference signal to thereby provide a second control signal, the clock supply circuit being responsive to the second control signal to advance or retard the first clock signal.

2. The circuit as claimed in claim 1 wherein the filter includes a low-pass filter.

3. The circuit as claimed, in claim 1 wherein the control signal circuit has a first loop delay $T_{D1}$ and the low-pass filter has a cutoff frequency less than $1/T_{D1}$.

4. The circuit as claimed in claim 1 wherein the controllable clock supply includes a controllable-frequency oscillator.

5. The circuit as claimed in claim 4 wherein the oscillator does not include an inductor.

6. The circuit as claimed in claim 4 wherein the oscillator is a voltage-controlled ring oscillator.

7. The circuit as claimed in claim 6 further comprising a clock-using circuit connected to the ring oscillator and driven by the first clock signal, wherein the connection between the ring oscillator and the clock-using circuit includes no more than one stage of amplification.

8. The circuit as claimed in claim 6 wherein the ring oscillator includes a plurality of inverters each having at least one output and at least one input, the inverters being connected to one another in an ordered series from a lowest-ordered inverter to a highest-ordered inverter, one or more outputs of each of the inverters being connected to one or more inputs of a next higher ordered one of the inverters, provided that one or more outputs of the highest-ordered one of the inverters are connected to one or more inputs of the lowest-ordered one of the inverters, and wherein the first clock signal includes at least four components taken from outputs of at least two of the inverters.

9. The circuit as claimed in claim 8 wherein the phase shifter is constructed and arranged to provide the intermediate signal with a number of components less than the number of the number of components in the first clock signal.

10. The circuit as claimed in claim 4 wherein the phase shifter is constructed and arranged to provide the intermediate signal with a number of components less than the number of components in the first clock signal.

11. The circuit as claimed in claim 1 wherein the first phase detector is operative to derive the first phase difference signal cyclically, each cycle including a plurality of bit intervals of the data signal.

12. The circuit as claimed in claim 11 wherein the first phase detector is operative to provide the first phase difference signal as a digital phase difference signal and the first control signal circuit is operative to provide the first control signal as a digital signal.

13. The circuit as claimed in claim 12 wherein the phase shifter is operative to vary the phase shift stepwise.

14. The circuit as claimed in claim 1 further comprising a data sampling circuit connected to the data input and clocked by the first clock signal.

15. A clock recovery circuit comprising:
  (a) means for comparing the phase of a first clock signal with the phase of a data signal to provide a first phase difference signal representing a phase difference between the first clock signal and a first control signal which is a function of the first phase difference signal;
  (b) means for altering the phase of an incoming clock signal responsive to the first control signal to thereby provide an second clock signal;
  (c) means for comparing the phase of the first clock signal with the phase of the second clock signal to thereby provide a second phase difference signal;
  (d) means for providing a second control signal which is a function of the second phase difference signal, the means for providing the second control signal including means for low-pass filtering the second phase difference signal; and
  (e) means for providing the first clock signal and advancing or retarding the first clock signal responsive to the second control signal.

* * * * *